United States Patent
Heinemann et al.

(10) Patent No.: US 8,605,848 B2
(45) Date of Patent: Dec. 10, 2013

(54) ARRANGEMENT FOR SYNCHRONIZING HIGH-FREQUENCY TRANSMITTERS OF A COMMON-WAVE NETWORK

(75) Inventors: Cornelius Heinemann, Erding (DE); Wolfgang Boehm, Siegertsbrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1013 days.

(21) Appl. No.: 12/295,919

(22) PCT Filed: Mar. 9, 2007

(86) PCT No.: PCT/EP2007/002099
§ 371 (c)(1),
(2), (4) Date: Jan. 19, 2009

(87) PCT Pub. No.: WO2007/115626
PCT Pub. Date: Oct. 18, 2007

(65) Prior Publication Data
US 2009/0252266 A1 Oct. 8, 2009

(30) Foreign Application Priority Data

Apr. 3, 2006 (DE) .................. 10 2006 015 393

(51) Int. Cl.
*H04L 7/00* (2006.01)
(52) U.S. Cl.
USPC ........... 375/356; 375/355; 375/371; 375/373; 375/375; 704/270.1
(58) Field of Classification Search
USPC ........................................ 375/356
See application file for complete search history.

(56) References Cited

U.S. PATENT DOCUMENTS

| 4,527,145 A * | 7/1985 | Haussmann et al. .......... 348/537 |
| 5,261,118 A | 11/1993 | Vanderspool et al. |

(Continued)

FOREIGN PATENT DOCUMENTS

| EP | 0653845 A1 | 5/1995 |
| WO | WO 02/080528 A1 | 10/2002 |
| WO | WO 2006/094053 A2 | 9/2006 |

OTHER PUBLICATIONS

"ATSC Standard: Synchronization Standard for Distributed Tranmission," ATSC Standard, Jul. 14, 2004, pp. 1-54.

(Continued)

*Primary Examiner* — Shuwang Liu
*Assistant Examiner* — Gina McKie
(74) *Attorney, Agent, or Firm* — Ditthavong Mori & Steiner, P.C.

(57) ABSTRACT

An arrangement for synchronizing a transmission time of a digital data stream in individual high-frequency transmitters of a common-wave network operating according to an ATSC standard and transmitting identical data at an identical frequency. The stream generated in a master station is supplied to the transmitters as a periodic succession of data frames, and a setpoint transmission time is calculated in the transmitters from a synchronizing time stamp inserted into the data frames within the master station and from a time reference used in the master station and transmitters, while the transmission of the frames by the transmitter is determined by a system clock in the transmitters. The setpoint transmission time is compared with the actual transmission time determined by the clock, and the clock frequency is regulated by a regulating circuit so that the actual transmission time determined by the clock corresponds with the calculated setpoint transmission time.

6 Claims, 1 Drawing Sheet

(56) References Cited

U.S. PATENT DOCUMENTS

| | | | |
|---|---|---|---|
| 5,416,808 A * | 5/1995 | Witsaman et al. | 375/356 |
| 6,239,720 B1 * | 5/2001 | Kim et al. | 340/5.1 |
| 6,483,825 B2 | 11/2002 | Seta | |
| 6,687,310 B1 * | 2/2004 | Fimoff et al. | 375/265 |
| 2003/0190002 A1 * | 10/2003 | Azakami et al. | 375/368 |
| 2006/0105703 A1 * | 5/2006 | Takizawa et al. | 455/3.01 |
| 2006/0153572 A1 * | 7/2006 | Champion et al. | 398/140 |
| 2006/0258324 A1 * | 11/2006 | Vare et al. | 455/343.3 |
| 2010/0313057 A1 * | 12/2010 | Wang | 713/500 |

OTHER PUBLICATIONS

International Preliminary Report on Patentability, PCT/EP2007/002099, Dec. 31, 2008, pp. 1-8.

Advanced Television Systems Committee, ATSC Standard: Synchronization Standard for Distributed Transmission, journal, Jul. 14, 2004, XP-001202456, Washington, D.C., USA.

* cited by examiner

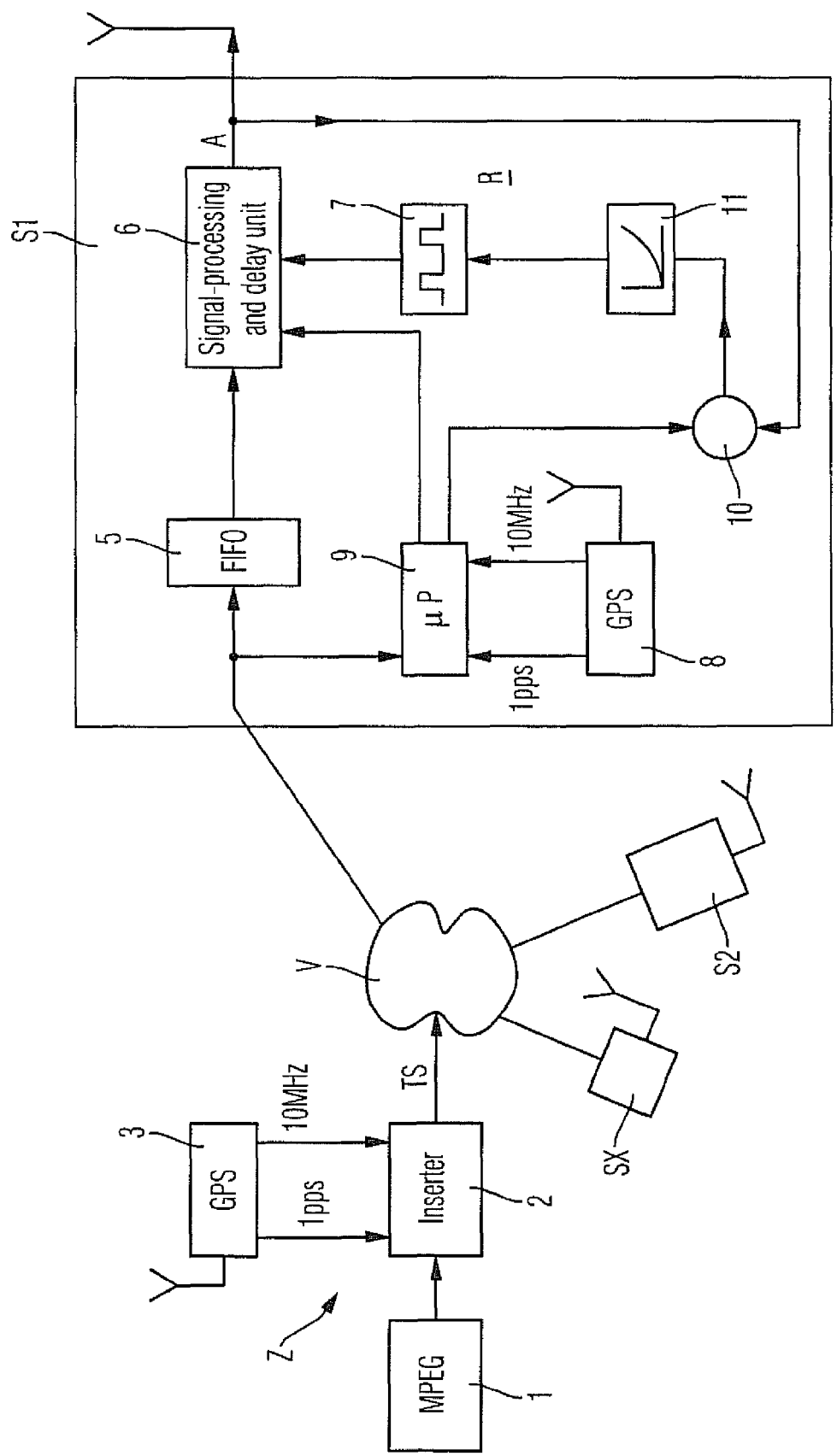

ARRANGEMENT FOR SYNCHRONIZING HIGH-FREQUENCY TRANSMITTERS OF A COMMON-WAVE NETWORK

CROSS-REFERENCE TO RELATED APPLICATION

The present application claims priority to German Application No. 10 2006 015 393.6 filed on Apr. 3, 2006, and to PCT Application No. PCT/EP2007/002099 filed on Mar. 9, 2007, the entire contents of which are herein incorporated by reference.

BACKGROUND OF THE INVENTION

1. Field of the Invention

The invention relates to arrangements for synchronizing transmission time of data streams of high-frequency transmitters of a common-wave network.

2. Discussion of the Background

For the USA and other countries such as Canada, South Korea or Brazil, the transmission of digital video and audio data as well as other digital data via terrestrial high-frequency transmitters is regulated by the ATSC (Advanced Television Systems Committee, Washington) standard (e.g., ATSC standard A/53). In practice, this standard has so far been used almost exclusively with reference to digital television transmitters each transmitting at a different frequency. In recent years, the demand for an increasing number of relatively-closely adjacent terrestrial television transmitters has led, in the USA also, to the introduction of so-called common-wave networks for data transmission, within which several transmitters transmit the same information within the same network at the same time and at the same transmission frequency. In addition to an accurate frequency synchronization, this also requires accurate time synchronization, so that the digital data stream is transmitted in exact synchronization by all transmitters in the network.

Various proposals for achieving this time synchronization within the framework of the ATSC standard are already in existence. These proposals share the feature that they do not supply the digital data stream to be transmitted as a continuous data stream to the transmitters; instead, the digital data stream to be transmitted is subdivided in a master station into a periodic succession of data frames, which are, in fact, controlled by a time reference, for example, derived from the GPS (Global Position System) (e.g., 1 pps pulse together with the reference frequency of 10 MHz transmitted via GPS). Within these data frames, so-called synchronizing time stamps are inserted at given positions of the data packets. The data frames prepared in this manner are then transmitted from the master station to the individual high-frequency transmitters via an appropriate distribution network (e.g., cable, radio channel, satellite channel, etc). In the individual transmitters, these data frames are supplied to a signal-processing unit with a delay element, where they are coded and modulated according to the ATSC standard.

Moreover, the setpoint transmission time determined according to the standard, at which the data frames are to be transmitted at the output of the individual transmitters, is calculated within the transmitters, in fact, from the synchronizing time stamps inserted in the data frames with reference to the same time reference, which was also used in the master station, that is to say, for example, once again, with reference to the 1 pps pulse of the GPS system. The setpoint transmission time calculated in this manner determines the necessary delay of the data frames within the delay device. The data frames delayed in the delay device are finally transmitted with a system clock supplied by a freely-oscillating clock generator provided in the transmitter, which is synchronized, for example, once again, via the 10 MHz reference frequency of the GPS, to the output of the transmitter, from which they are finally transmitted via the antenna.

Initial experiments with these known proposals for expanding the ATSC standard for common-wave networks have shown that short-term interruptions of the transmitted signal frequently occur. The known proposals actually only function in a stable manner if all of the signals are exactly synchronized with one another, that is to say, the data rate and frame lengths of the data signal; the time reference (e.g., 1 pps of the GPS receiver); and the system clock of the clock generator generated in the transmitter itself, with which the transmitted signal is transmitted. In practice, however, this is often not the case, because many GPS receivers do not actually deliver the 1 pps pulse and the reference frequency 10 MHz in a synchronous manner. Accordingly, the "curved-value" system clock provided for reading out the data frames from the delay device cannot always be generated with 100% accuracy. Moreover, the supply routes from the master station to the transmitters can change the data rates and therefore the frame periods of the data signal, for example, in the case of satellite supply and similar, as a result of Doppler effects. In consequence, the delay time calculated in the transmitter and set in the delay element is no longer correct, but deviates to a greater or lesser extent from the setpoint value. According to the known systems, a new delay time is calculated and set in such cases. However, this leads to an interruption of the transmitted signal with the associated disturbances, as already mentioned.

SUMMARY OF THE INVENTION

The present invention advantageously improves the previously-known proposals for expanding the ATSC standard for the common-wave network structure in such a manner that signal interruptions of the kind described above are avoided with certainty.

Thus, an arrangement is provided for synchronizing a transmission time of a digital data stream in individual high-frequency transmitters of a common-wave network operating according to an ATSC standard and transmitting respectively identical data at an identical frequency, where the digital data stream (TS) generated in a master station (Z) is supplied to the individual transmitters (S1 to SX) in the form of a periodic succession of data frames, and a setpoint transmission time is calculated in the transmitters from a synchronizing time stamp inserted into the data frames within the master station and from a time reference used both in the master station and also in the transmitters, while the transmission of the data frames at the output (A) of the transmitter is determined by a system clock generated in the transmitters. In such an arrangement the setpoint transmission time in each transmitter (S1 to SX) is compared with the actual transmission time determined by the system clock of the data frames at the output (A) of the transmitter and, dependent upon this comparison, the clock frequency of clock generator is regulated by means of a regulating circuit (R) in such a manner that the actual transmission time determined by the system clock corresponds with the calculated setpoint transmission time.

According to an embodiment of the invention, the system clock generated locally in the transmitter is regulated with a simple regulating circuit by comparing the actual transmission time at the output of the transmitter with a setpoint transmission time calculated in a known manner within the transmitter in such a manner that any time displacements are automatically levelled. In this context, the change in the system clock is disposed within the mHz range, so that the common-wave network itself is not disturbed. However, this is not sufficient to level time errors within the range of ±10 ms. For larger deviations, the time delay is adapted as previously. The regulation according to the invention avoids signal interruptions. The actual transmission time can be regulated back to the calculated setpoint transmission time dependent upon the size of the deviation in several successive stages within several successive data frames.

BRIEF DESCRIPTION OF THE DRAWINGS

The invention is described in greater detail below on the basis of a schematic drawing with reference to an exemplary embodiment. The drawing is as follows:

FIG. 1 shows a schematic structure of a common-wave network operating according to the ATSC standard, wherein a regulating circuit according to an embodiment of the invention is allocated to each of the high-frequency transmitters used in this context.

DETAILED DESCRIPTION OF EXEMPLARY EMBODIMENTS OF THE INVENTION

According to the known proposals mentioned in the introduction, the digital data stream to be transmitted is supplied, for example, from an MPEG (Moving Pictures Expert Group) source 1 in a master station Z to an inserter 2, in which, in a manner controlled by the 1 pps pulse of a GPS receiver 3 and its 10 MHz reference frequency, a data stream TS in the form of a periodic succession of data frames is generated with synchronizing time stamps inserted in selected data packets in each of the data frames, for example, respectively in the last $623^{rd}$ transport-stream packet of every data frame. This sequence of data frames with inserted synchronizing time stamps is transmitted via a distribution network V to the individual transmitters S1 to SX, where it is converted into high-frequency signals and transmitted from antennae. In the example, only one transmitter S1 is shown in detail; in practice, however, as many transmitters as required can be supplied with the central data stream TS via the distribution network V. All of the transmitters, S1 to SX respectively, transmit the same channel with the same transmission frequency.

In each transmitter, the incoming stream of data frames is read into an input data buffer 5 for clock decoupling and supplied from there to a signal-processing and delay device 6, which is clock-controlled via a system-clock generator 7. In the signal-processing device, the incoming stream of data frames is coded and modulated according to the ATSC standard and then output at the output A of this device 6 as a high-frequency, intermediate-frequency or baseband signal, and finally provided for transmission. It is substantial that the processing units, such as amplifiers, frequency converters, and similarly disposed units, after this output A of the device 6 provide a constant processing time.

In the delay device 6, which is supplied with clock pulses by the system clock 7, the data frames are delayed in time, according to the proposals mentioned in introduction, by a delay time calculated in the transmitter. The delay time is calculated from the synchronizing time stamps of the data frames with reference to the time reference used in the master station, which, for its part, is re-evaluated via a GPS receiver 8 in a calculation circuit 9 within every transmitter. The delay in the delay device G is adjusted with the delay time calculated in this manner.

The arrangement described so far corresponds to the known proposals mentioned in the introduction for the expansion of the ATSC system and also still provides the disadvantages mentioned in introduction with regard to the signal interruption as a result of the necessity to re-calculate the delay time in the event of any signal deviations.

According to the invention, a regulating circuit R is now additionally provided in every individual transmitter, in which the setpoint transmission time calculated in the calculation circuit 9 is compared in a time comparator 10 with the actual transmission time at the output A of the signal-processing and delay unit 6. In the event of a time deviation within the μs range between the actual value and the setpoint value, an adjustment parameter for the system-clock generator 7 is generated via a regulating element 11 with a predetermined regulating characteristic, and the system clock is regulated in such a manner that the beginning of the transmission of every data frame in every transmitter is continuously regulated respectively towards the setpoint transmission time without an adjustment of the delay in the delay device G.

If the comparator 10 determines that the actual transmission time is transmitted by a few μs later than specified by the setpoint transmission time, the system clock is raised via the regulating circuit R thereby transmitting the output signal earlier; conversely, if the system clock is reduced by a few mHz the output signal is transmitted later.

The regulating characteristic of the regulating element 11 is selected as required, for example, in such a manner that a specified deviation is levelled after only a few data frames. In many cases, it is sufficient to implement this levelling in relatively small steps distributed over several successive data frames.

The invention claimed is:

1. An arrangement comprising:
   a master station;
   individual high frequency transmitters of a common wave network operating according to an ATSC standard and transmitting respectively identical data at an identical frequency;
   wherein the
   master station generates a digital data stream and supplies the digital data stream to the individual transmitters as a periodic succession of data frames, a setpoint transmission time is calculated in the transmitters from a synchronizing time stamp inserted into the data frames within the master station and from a time reference used both in the master station and also in the transmitters, and the transmission of the data frames at an output of the transmitter is determined by a system clock generated by a system clock generator in the transmitters,
   a time comparator for comparing the setpoint transmission time in each transmitter with an actual transmission time determined by the system clock of the data frames at the output of the transmitter and,
   a regulating circuit for regulating, responsive to the comparison, a clock frequency of the system clock generator in such a manner that the actual transmission time determined by the system clock corresponds with the calculated setpoint transmission time;
   wherein, if the time comparator determines that the actual transmission time is later than the setpoint transmission time, the system clock is increased via the regulating circuit, thereby transmitting an output signal earlier and, if the time comparator determines that the actual transmission time is earlier than the setpoint transmission time, the system clock is decreased via the regulating circuit, thereby transmitting the output signal later.

2. The arrangement according to claim 1,
wherein, within the master station, periodic successions of data frames with inserted synchronizing time stamps are generated from the digital data stream to be transmitted in a manner controlled by the time reference used both in the master station and also in the individual transmitters and transmitted via a distribution network to the individual transmitters, and wherein, within the transmitters, these data frames are supplied to a delay unit, in which the data frames are delayed by a delay time calculated from the synchronizing time stamp with reference to the time reference and corresponding to the setpoint transmission time, and from which the data frames are transmitted at the output of the transmitters in a manner controlled by the system clock generator.

3. The arrangement according to claim 2,
wherein the setpoint transmission time calculated in the transmitters is compared in the time comparator with the actual transmission time of the data frames at the output of the transmitter determined by the system clock, and an adjustment parameter for the system clock generator is generated via the time comparator and the regulating circuit in such a manner that the clock frequency of the system clock generator is regulated in such a manner that the actual transmission time of the data frames at the output of every transmitter determined by the system clock corresponds in every case with the calculated setpoint transmission time.

4. A method for synchronizing transmission time of a digital data stream in individual high-frequency transmitters of a common-wave network operating according to an ATSC standard and transmitting respectively identical data at an identical frequency, said method comprising:

generating the digital data stream in a master station;

supplying the digital data stream generated in the master station to the individual transmitters as a periodic succession of data frames;

calculating a setpoint transmission time in the transmitters from a synchronizing time stamp inserted into the data frames within the master station and from a time reference used both in the master station and also in the transmitters, while the transmission of the data frames at an output of the transmitter is determined by a system clock generated by a system clock generator in the transmitters; and comparing the setpoint transmission time in each transmitter with an actual transmission time determined by the system clock of the data frames at the output of the transmitter; and dependent upon the comparison, regulating a clock frequency of the system clock generator by a regulating circuit in such a manner that the actual transmission time determined by the system clock corresponds with the calculated setpoint transmission time;

wherein, if the comparison determines that the actual transmission time is later than the setpoint transmission time, the system clock is increased via the regulating circuit, thereby transmitting an output signal earlier and, if the comparison determines that the actual transmission time is earlier than the setpoint transmission time, the system clock is decreased via the regulating circuit, thereby transmitting the output signal later.

5. The method according to claim 4,
wherein, within the master station, periodic successions of data frames with inserted synchronizing time stamps are generated from the digital data stream to be transmitted in a manner controlled by the time reference used both in the master station and also in the individual transmitters and transmitted via a distribution network to the individual transmitters, and wherein, within the transmitters, these data frames are supplied to a delay unit, in which the data frames are delayed by a delay time calculated from the synchronizing time stamp with reference to the time reference and corresponding to the setpoint transmission time, and from which the data frames are transmitted at the output of the transmitters in a manner controlled by the system clock generator.

6. The method according to claim 5,
wherein the setpoint transmission time calculated in the transmitters is compared in a time comparator with the actual transmission time of the data frames at the output of the transmitter determined by the system clock, and an adjustment parameter for the system clock generator is generated via this time comparator and a regulating element in such a manner that the clock frequency of the system clock generator is regulated in such a manner that the actual transmission time of the data frames at the output of every transmitter determined by the system clock corresponds in every case with the calculated setpoint transmission time.

* * * * *